United States Patent
Ou et al.

(10) Patent No.: US 7,060,595 B2
(45) Date of Patent: Jun. 13, 2006

(54) CIRCUIT SUBSTRATE AND FABRICATION METHOD THEREOF

(75) Inventors: In-De Ou, Kaohsiung (TW); Chih-Pin Hung, Kaohsiung (TW); Chia-Shang Chen, Hsinchu (TW); Kuang-Hua Lin, Hsinchu (TW); Shin-Hua Chao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 115 days.

(21) Appl. No.: 10/627,609

(22) Filed: Jul. 28, 2003

(65) Prior Publication Data

US 2004/0080052 A1    Apr. 29, 2004

(30) Foreign Application Priority Data

Oct. 24, 2002    (TW) ................. 91124812 A

(51) Int. Cl.
*H01L 21/20*    (2006.01)
*H01L 21/36*    (2006.01)

(52) U.S. Cl. ............... 438/484; 438/108; 438/667
(58) Field of Classification Search ............ 438/108, 438/113, 125, 164, 484, 523, 667, 678
See application file for complete search history.

(56) References Cited

U.S. PATENT DOCUMENTS

| | | | |
|---|---|---|---|
| 6,406,939 B1 * | 6/2002 | Lin ............................ | 438/108 |
| 6,600,214 B1 * | 7/2003 | Ishikawa et al. ............ | 257/622 |
| 6,618,940 B1 * | 9/2003 | Lubert et al. ................ | 29/846 |

* cited by examiner

*Primary Examiner*—Phuc T. Dang
(74) *Attorney, Agent, or Firm*—Bacon & Thomas, PLLC

(57) ABSTRACT

A circuit substrate includes a board, a plurality of metal layers and an insulator. The board has a plurality of conductive traces layers and a via formed therein. The metal layers are formed on the inner wall of the via and each of the metal layers is electrically connected to its corresponding conductive traces layer. The via is filled with the insulator so that each of the metal layers is electrically isolated from each other. In addition, this invention also provides a fabrication method of the circuit substrate.

14 Claims, 6 Drawing Sheets

CIRCUIT SUBSTRATE AND FABRICATION METHOD THEREOF

BACKGROUND OF THE INVENTION

1. Field of Invention

This invention relates to a circuit substrate and a fabrication method thereof. More particularly, the present invention is directed to a circuit substrate, suitable for an integrated circuit, and fabrication method thereof.

2. Related Art

Presently, circuit substrate is commonly employed as carrier in electrical industry. Not only circuit substrate is employed as printed circuit board (PCB) but also package substrate, which is applicable to an integrated circuit package. Recently, a high-density circuit substrate having multiple layers and conductive traces with fine pitches is improved for the integration of the integrated circuits (ICs), and the need of thinner ICs package and higher input/output counts.

As shown in FIG. 1, a circuit substrate 10 mainly includes a board 100. The board 100 comprises a core board 101, a plurality of insulating layers 110 and conductive traces layers 130. The insulating layers 110 and the conductive traces layers 130 are interlaced with each other. The conductive traces layers 130 are electrically connected with each other through vias 140 such as through holes, buried vias or blind vias. Now taken a through hole for example as shown in FIG. 1, initially, the insulating layers 110 and the conductive traces layers 130, which are interlaced with each other, are penetrated to form a through hole therein by the method of mechanical drilling or laser ablation. Next, the inner wall of the through hole is electro-less plated with a copper film and then another copper layer is deposited on the copper film. Finally, the through hole is filled with an insulating material, for example epoxy and ink. Now referring to FIG. 2, via land 160 is disposed at the periphery of the via 140 to electrically connect the conductive traces 130a and the via 140. Generally speaking, if the diameter of the via 140 is about 300 μm, the diameter of the via land 160 will be about 500 μm. In addition, a landless design can be employed to save the area for the arrangement of the via land 160. However, the process of the landless design is complex and the cost is increased.

As shown in FIG. 2, the via lands 160 occupy a lot of areas so that the areas for laying out the conductive traces are reduced. In such a manner, the conductive traces 130a will be finer and the pitches between the conductive traces will be fined down. Consequently, it will be difficult to fabricate the circuit substrate. Besides, the quality of the electricity will be seriously affected in that, with reference to FIG. 2, the bent portions of the conductive traces and the distance of the signal transmission are increased.

As shown in FIG. 3, the previously mentioned problems can be solved and improved by directly reducing the diameter of via 240. Plasma, Nd:YAG laser and excimer laser can be utilized to form via 240 with smaller diameter. When the diameter of the via 240 is reduced, the areas for laying out the conductive traces 230a can be increased to reduce the bent portions of the conductive traces 230a. However, the fabrication method of plating metal layer on the inner wall of the via 240 will become more complex due to the smaller diameter of the via 240.

SUMMARY OF THE INVENTION

In view of the above-mentioned problems, an objective of this invention is to provide a circuit substrate and a fabrication method thereof, which can increase the density of the conductive traces layout in the circuit substrate without reducing the width of the conductive traces and the pitches between the conductive traces.

It is another objective of the invention to provide a circuit substrate and a fabrication method thereof, which can reduce the distance of signal transmission.

To achieve the above-mentioned objective, a circuit substrate of this invention includes a board, a plurality of metal layers and an insulator. In this invention, the board includes a plurality of conductive traces layers and insulating layers, and at least one via formed therein. The metal layers are formed on the inner wall of the via and electrically connected to the corresponding conductive traces layers. The via is filled with an insulator so that the metal layers disposed in the same via are electrically isolated from each other.

Furthermore, the invention also discloses a fabrication method of the circuit substrate as mentioned above. The fabrication method includes the steps of providing a board with a plurality of conductive traces layers and insulating layers wherein at least one via is formed in the board, forming metal layers on the inner wall of the via, cutting the via to form at least one cutting street to separate the metal layers into a plurality of separated metal layers and filling an insulator in the via and the cutting street.

Circuit substrate of this invention is formed by filling an insulator in the via and the cutting street so that the metal layer formed on the inner wall of the via is separated into a plurality of separated metal layers. In such a manner, the separated metal layers in the via are electrically isolated from each other. In other words, each separated metal layers in the same via can be provided to electrically connect its corresponding conductive traces layer. Consequently, the number of the vias will be reduced so as to increase the density of the conductive traces layout. Besides, it can also reduce the bent portions of the conductive traces so as to reduce the distance of signal transmission.

Moreover, this invention further discloses a fabrication method of the circuit substrate as mentioned above. The method includes the steps of forming a metal layer on the inner wall of the via, cutting the via to form at least one cutting street to separate the metal layer into a plurality of separated metal layers. In such a manner, the via can be separated into a plurality of separated vias. Consequently, not only this process can simplify the process of plating metal layers on the inner wall of smaller via, but also speed up the formation for large amount of the vias.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The circuit substrate and fabrication method thereof according to the preferred embodiment of this invention will be described herein below with reference to the accompanying drawings, wherein the same reference numbers refer to the same elements.

Figure 1:
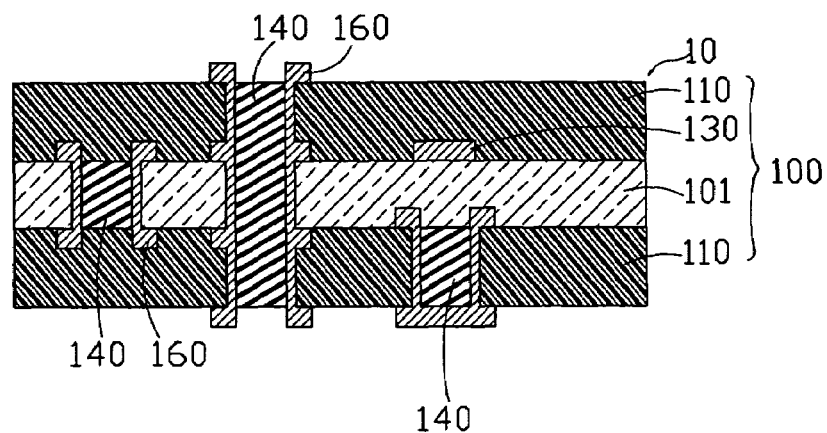
FIG. 1 is a cross-sectional view of a conventional circuit substrate.
Figure 2:
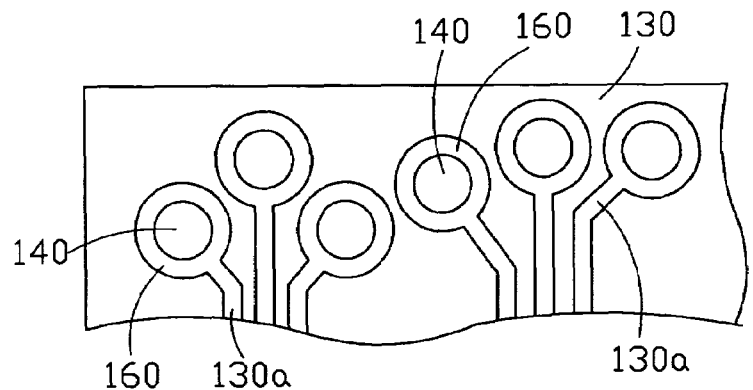
FIG. 2 is a top view of the conventional circuit substrate of FIG. 1.
Figure 3:
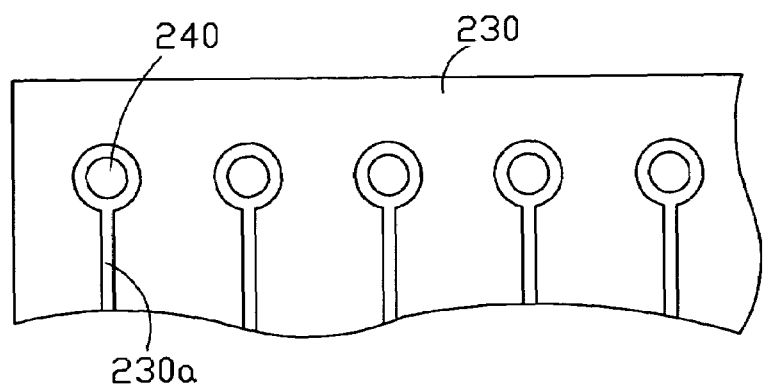
FIG. 3 is a top view of another conventional circuit substrate.
Figure 4A:
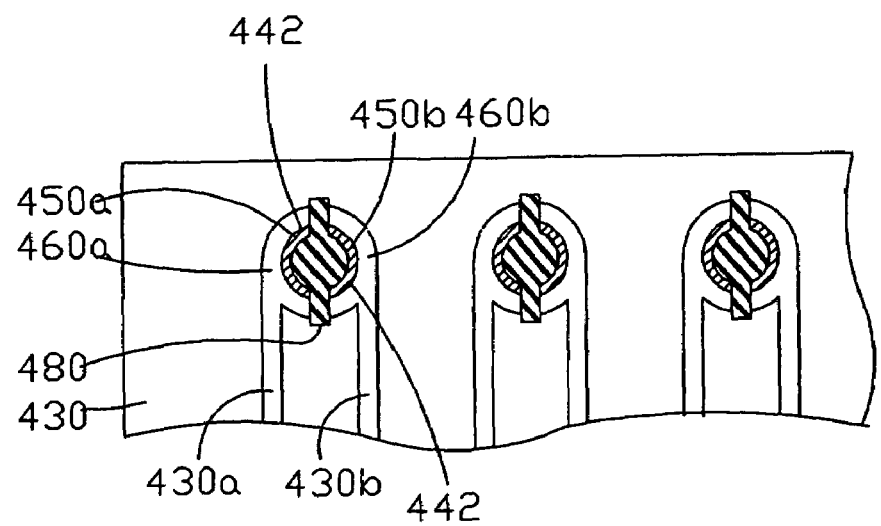
FIG. 4A is a top view of a circuit substrate in accordance with the present invention.
Figure 4B:
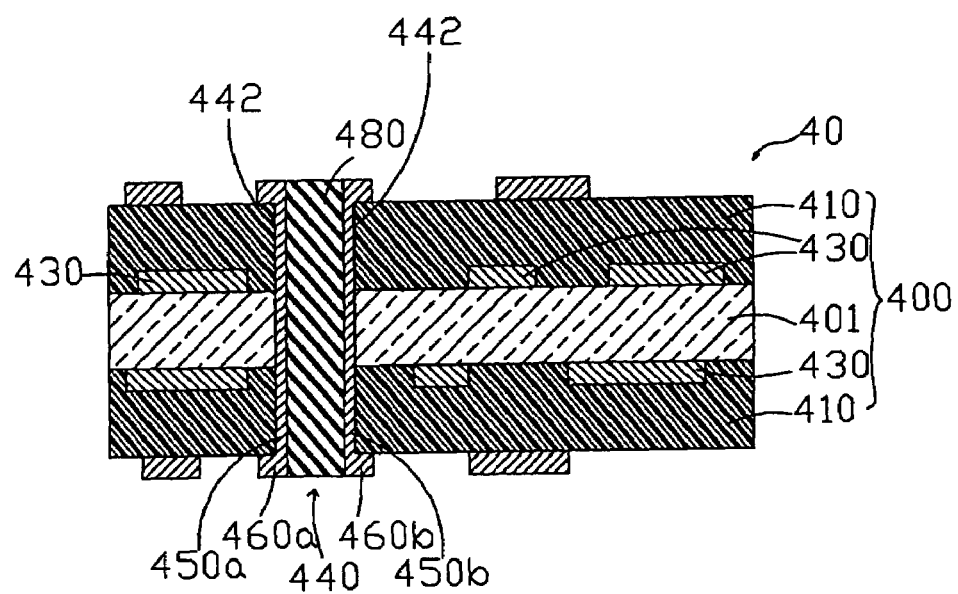
FIG. 4B is a cross-sectional view of the circuit substrate of FIG. 4A.

In accordance with a preferred embodiment as shown in FIGS. 4A and 4B, a circuit substrate 40 includes a board 400, a via 440, metal layers 450a and 450b, and an insulator 480. The board 400 comprises a core board 401, and a plurality of insulating layers 410 and conductive traces layers 430 wherein the insulating layers 410 and the conductive traces layers 430 are interlaced with each other. The material of the insulating layers 410 can be Bismaleimide-Triazine (BT), glass epoxy resins (FR4), epoxy or polyimide. The conductive traces layer 430 can be formed by the steps of forming a copper foil on the surface of the insulating layer 401, forming a patterned photo-resist layer on the copper foil, removing a portion of the copper foil by etching and using photo-resist layer as a mask, and removing the photo-resist layer.

Via 440 can be formed by a mechanical method or a chemical method, and the via 440 can be a through hole, a buried via or a blind via. Metal layers 450a and 450b can be formed on the inner wall 442 of the via 440 by the method of electro-less plating or direct plating. Via lands 460a and 460b are disposed on the board 400 and at the periphery of the via 440, and the material of the via lands 460a and 460b are with good electrical conductivity. Generally speaking, the material of the via lands 460a and 460b is substantially the same as the conductive traces 430a and 430b, for example copper metal. The via 440 is filled with an insulator 480 which separates the via 440 into a plurality of separated vias (not shown), and the metal layers 450a and 450b are electrically isolated from each other by the insulator 480. In addition, the via lands 460a and 460b are also electrically isolated from each other. The insulator 480 can be made of insulating materials, for example epoxy resin and ink. Besides, the metal layers 450a and 450b are electrically connected with the conductive traces 430a and 430b through the via lands 460a and 460b.

Figure 5A:
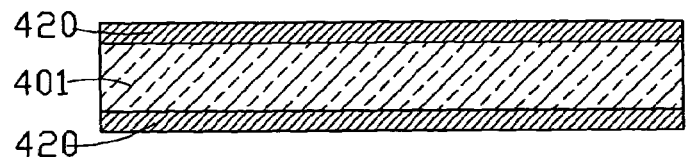
FIG. 5A to 5H are cross-sectional views illustrating the process flow of a fabrication method of the circuit substrate of FIG. 4A.
Figure 5B:
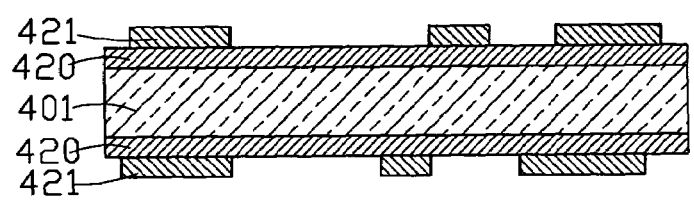
Figure 5C:
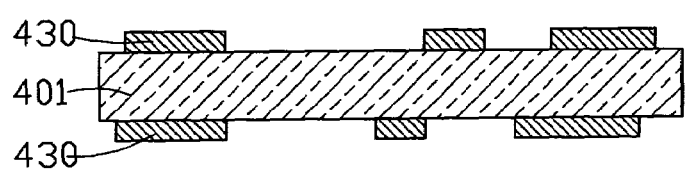

FIG. 5A to FIG. 5G illustrate the fabrication method of the circuit substrate in accordance with the invention as mentioned above. As shown in FIG. 5A, a core board 401 that is made of a prepreg with higher hardness and higher glass transition temperature (Tg) is provided with a copper foil 420 disposed on the top surface 401a and bottom surface 401b. Referring to FIG. 5B and FIG. 5C, the conductive traces layer 430 as shown in FIG. 5C are formed by the steps of forming photo-resists 421 on the copper foils 420 and patterning the copper foils 420 by exposure, development and etching processes.

Figure 5D:
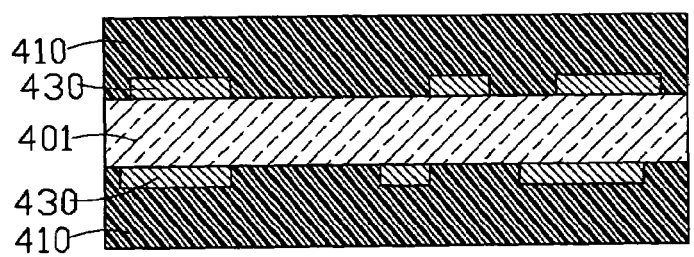
Figure 5E:
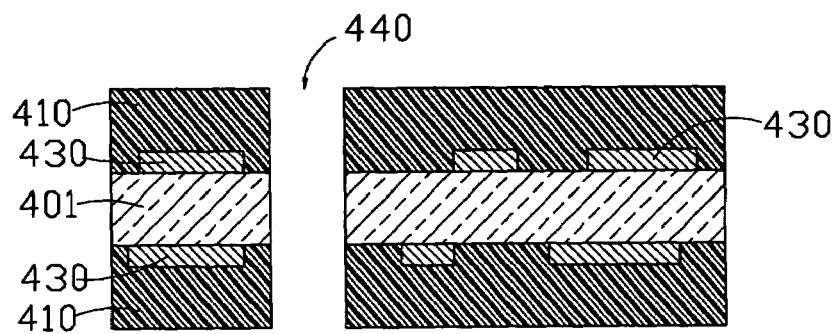

Next, an insulating material is coated on the conductive traces layers 430 to form insulating layers 410 as shown in FIG. 5D. Then the steps as shown in FIG. 5A, FIG. 5B and FIG. 5C are repeated to form the board having a plurality of insulating layers 410 and a plurality of conductive traces layers 430 wherein the insulating layers 410 and the conductive traces layers 430 are interlaced which each other. After that, as shown in FIG. 5E, the via 440 is formed by the methods of mechanical drilling, laser ablation, photochemical reaction and plasma etching.

Figure 5F:
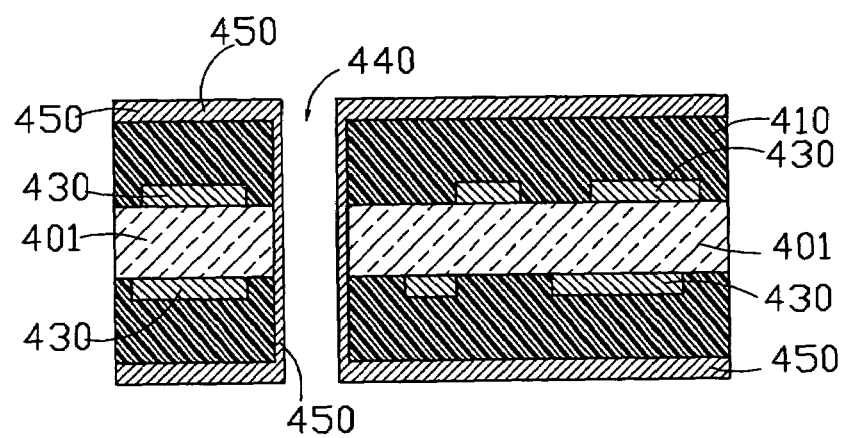

Referring to FIG. 5F, a metal layer 450 is formed on the inner wall 442 of the via 440 and the surfaces 412 and 414 of the insulating layers 410. Since the inner wall 442 of the via 440 and the surfaces 412 and 414 of the insulating layers 410 are made of composite material, the activated material, for example barium (Ba) and conductive polymer, shall be disposed on the inner wall 442 of the via 440 and the surfaces 412 and 414 of the insulating layers 410 in advance. Then, a thin copper film is formed on the inner wall 442 of the via 440 and the surfaces 412 and 414 of the insulating layers 410 by the method of electro-less plating, wherein the thickness of the thin copper film is about 0.5 μm. Next, another copper layer is directly formed on the thin copper film to form a metal layer 450, wherein the thickness of the metal layer 450 is about 20 μm. Besides, the metal layer 450 can be formed by the method of direct plating. The method of direct plating comprises the steps of forming a conductive polymer or a conductive carbon layer on the inner wall 442 of the via 440 and the surfaces 412 and 414 of the insulating layers 410, and forming the metal layer 450 on the conductive polymer or conductive carbon layer.

Figure 5G:
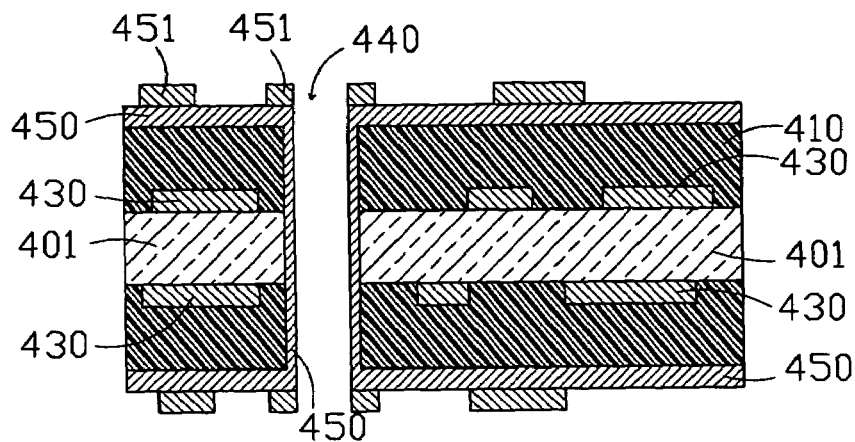
Figure 5H:
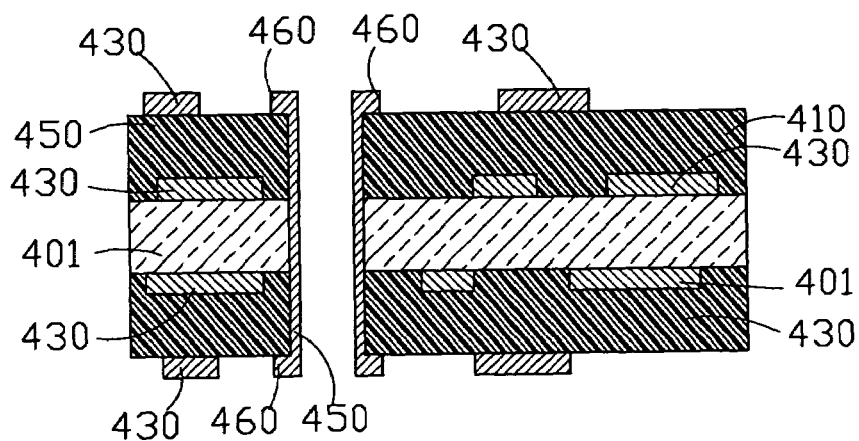

Referring now to FIG. 5G, a photolithography process is provided to form the conductive traces layers 430 and via lands 460 as shown in FIG. 5H. The photolithography process comprises the steps of forming photo-resist layers 451 on the metal layers 450 disposed respectively on the insulating layers 410, patterning the photo-resist layers 451 by exposure and development, etching a portion of the metal layers 450 by using the photo-resist layers 451 as a mask and removing the photo-resist layers 451.

Figure 5I:
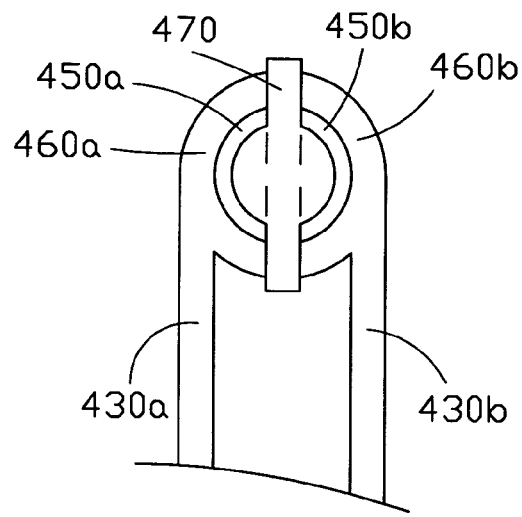
FIG. 5I to 5J are top views illustrating the process flow of a fabrication method of the circuit substrate of FIG. 4A.

Next, referring to FIG. 5I, the cutting street 470 of the via 440 is formed by cutting the via through the method of laser ablation wherein the methods comprise $CO_2$ Laser, Nd:YAG laser and excimer laser. Besides, the cutting street 470 can be formed by the method of mechanical drilling, photo-chemical reaction or plasma etching. The cutting street 470 separates the via 440 into two separated vias (not shown). Consequently, the metal layer 450 of the inner wall 442 of the via 440 are separated into two separated metal layers 450a and 450b, and the via land 460 are also separated into two separated via lands 460a and 460b.

Figure 5J:
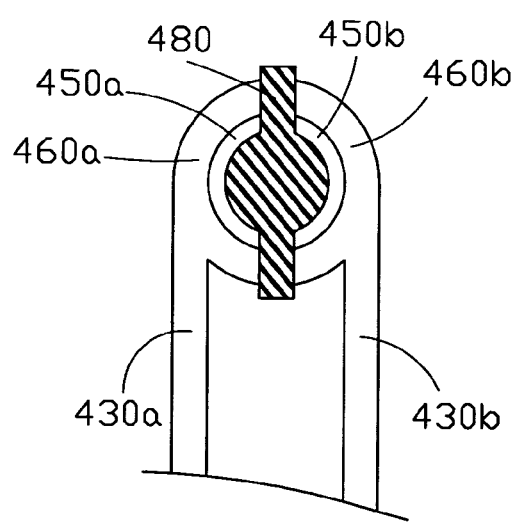

As shown in FIG. 5J, the via 440 is entirely filled with an insulator 480, for example epoxy resin. In such manner, the separated metal layers 450a and 450b disposed on the inner wall 442 of the via 440 can be electrically isolated from each other and electrically connected to the conductive traces 430a and 430b respectively.

As mentioned above, this invention has following advantages.

1. The circuit substrate in accordance with this invention utilizes the insulator to separate the metal layer formed on the inner wall of the via into a plurality of separated metal layers which are electrically isolated form each other. Consequently, each metal layer can be electrically connected to different conductive trace. In other words, because the functions of a plurality of vias in a conventional circuit substrate can be integrated in one via as specified in this invention, the areas occupied by the vias can be reduced and the density of the conductive traces layout can be increased. Besides, the bent portions of the conductive traces will be reduced so as to shorten the distance of signal transmission.

2. The fabrication method in accordance with this invention comprises the steps of forming a metal layer on the inner wall of the via and cutting the via to form cutting streets to separate the metal layer into a plurality of separated metal layers. Consequently, this fabrication method not only prevents from the difficulty of plating process during the formation of the via with fine diameter but speeding up the formation for large amount of the vias.

Although the invention has been described in considerable detail with reference to certain preferred embodiments, it will be appreciated and understood that various changes and modifications may be made without departing from the spirit and scope of the invention as defined in the appended claims.

What is claimed is:

1. A fabrication method of a circuit substrate, comprising:
   providing a board;
   forming a via in the board;
   forming a metal layer on an inner wall of the via;
   cutting the via to form a cutting street to separate the metal layer into a plurality of separated metal layers; and
   filling an insulator in the via and the cutting street, wherein the material of the insulator is ink.

2. The fabrication method of a circuit substrate of claim 1, further comprising:
   forming a via land on the board and at the periphery of the via.

3. The fabrication method of a circuit substrate of claim 2, wherein cutting the via further separates the via land into a plurality of separated via lands.

4. The fabrication method of a circuit substrate of claim 1, wherein the via is a through hole.

5. The fabrication method of a circuit substrate of claim 1, wherein the via is a blind via.

6. The fabrication method of a circuit substrate of claim 1, wherein the material of the metal layer is copper.

7. The fabrication method of a circuit substrate of claim 1, wherein the material of the insulator is epoxy.

8. The fabrication method of a circuit substrate of claim 1, wherein the board comprises a plurality of insulating layers and conductive trace layers, and the insulating layers are interlaced with the conductive trace layers.

9. The fabrication method of a circuit substrate of claim 1, wherein forming the metal layer on the inner wall of the via comprises:
   forming an activated film on the inner wall of the via by electro-less plating; and
   forming a metal film on the activated film by plating.

10. The fabrication method of a circuit substrate of claim 9, wherein the activated film comprises a conductive polymer film.

11. The fabrication method of a circuit substrate of claim 1, wherein cutting the via comprises mechanical drilling.

12. The fabrication method of a circuit substrate of claim 1, wherein cutting the via comprises laser ablation.

13. The fabrication method of a circuit substrate of claim 1, wherein cutting the via comprises photochemical reaction.

14. The fabrication method of a circuit substrate of claim 1, wherein cutting the via comprises plasma etching.

* * * * *